United States Patent
Ahn et al.

(10) Patent No.: US 11,005,596 B2
(45) Date of Patent: May 11, 2021

(54) APPARATUS AND METHOD FOR DETERMINING POLAR CODE IN WIRELESS COMMUNICATION SYSTEM

(71) Applicants: Samsung Electronics Co., Ltd., Suwon-si (KR); POSTECH ACADEMY-INDUSTRY FOUNDATION, Pohang-si (KR)

(72) Inventors: Seok-Ki Ahn, Suwon-si (KR); Jiwon Park, Pohang-si (KR); Kyeongcheol Yang, Pohang-si (KR); Daeyeol Yang, Pohang-si (KR); Sunghye Cho, Pohang-si (KR)

(73) Assignees: Samsung Electronics Co., Ltd., Suwon-si (KR); POSTECH Academy-Industry Foundation, Pohang-si (KR)

( * ) Notice: Subject to any disclaimer, the term of this patent is extended or adjusted under 35 U.S.C. 154(b) by 0 days.

(21) Appl. No.: 16/641,205

(22) PCT Filed: Aug. 22, 2018

(86) PCT No.: PCT/KR2018/009666
§ 371 (c)(1),
(2) Date: Feb. 21, 2020

(87) PCT Pub. No.: WO2019/039864
PCT Pub. Date: Feb. 28, 2019

(65) Prior Publication Data
US 2020/0228145 A1 Jul. 16, 2020

(30) Foreign Application Priority Data
Aug. 23, 2017 (KR) .................. 10-2017-0106657

(51) Int. Cl.
*H04L 1/00* (2006.01)
*H03M 13/09* (2006.01)
(Continued)

(52) U.S. Cl.
CPC .......... *H04L 1/0041* (2013.01); *H03M 13/09* (2013.01); *H03M 13/13* (2013.01); *H03M 13/2927* (2013.01); *H04L 1/0061* (2013.01)

(58) Field of Classification Search
CPC .... H03M 13/09; H03M 13/033; H03M 13/13; H03M 13/2927; H04L 1/0003; H04L 1/0041; H04L 1/0061
See application file for complete search history.

(56) References Cited

U.S. PATENT DOCUMENTS

2015/0092886 A1 4/2015 Ionita et al.
2015/0295593 A1 10/2015 Trifonov et al.
(Continued)

OTHER PUBLICATIONS

ISA/KR, International Search Report and Written Opinion of the International Searching Authority, International Application No. PCT/KR2018/009666, dated Nov. 20, 2018, 9 pages.

*Primary Examiner* — Shelly A Chase

(57) ABSTRACT

The present disclosure relates to a pre-5$^t$-Generation (5G) or 5G communication system to be provided for supporting higher data rates Beyond 4$^{th}$-Generation (4G) communication system such as Long Term Evolution (LTE). A method for operating a transmitting stage in a wireless communication system includes generating a signal by encoding an input bit sequence according to polar code determined from a linear code, and transmitting the signal to a receiving stage. The input bit sequence includes a second frozen bit which is determined based on a first frozen bit and an information bit. The first frozen bit and the information bit precede the second frozen bit in the input bit sequence.

20 Claims, 16 Drawing Sheets

(51) Int. Cl.
*H03M 13/13* (2006.01)
*H03M 13/29* (2006.01)

(56) References Cited

U.S. PATENT DOCUMENTS

| | | |
|---|---|---|
| 2016/0013810 A1 | 1/2016 | Gross et al. |
| 2016/0294418 A1 | 10/2016 | Huang et al. |
| 2017/0155405 A1 | 6/2017 | Ge et al. |
| 2017/0214416 A1 | 7/2017 | Ge et al. |
| 2018/0234204 A1* | 8/2018 | Nammi ................. H04L 1/0003 |
| 2019/0081731 A1* | 3/2019 | Kurmaev ............ H03M 13/033 |

* cited by examiner

APPARATUS AND METHOD FOR DETERMINING POLAR CODE IN WIRELESS COMMUNICATION SYSTEM

CROSS-REFERENCE TO RELATED APPLICATIONS

This application is a 371 National Stage of International Application No. PCT/KR2018/009666, filed Aug. 22, 2018, which claims priority to Korean Patent Application No. 10-2017-0106657 filed Aug. 23, 2017, the disclosures of which are herein incorporated by reference in their entirety.

BACKGROUND

1. Field

The present disclosure relates generally to a wireless communication system. More particularly, the present disclosure relates to an apparatus and a method for determining a polar code in the wireless communication system.

2. Description of Related Art

To meet the demand for wireless data traffic having increased since deployment of $4^{th}$ generation (4G) communication systems, efforts have been made to develop an improved $5^{th}$ generation (5G) or pre-5G communication system. Therefore, the 5G or pre-5G communication system is also called a 'Beyond 4G Network' or a 'Post Long Term Evolution (LTE) System'.

The 5G communication system is considered to be implemented in higher frequency (mmWave) bands, e.g., 60 GHz bands, so as to accomplish higher data rates. To decrease propagation loss of the radio waves and increase the transmission distance, the beamforming, massive multiple-input multiple-output (MIMO), Full Dimensional MIMO (FD-MIMO), array antenna, an analog beam forming, large scale antenna techniques are discussed in 5G communication systems.

In addition, in 5G communication systems, development for system network improvement is under way based on advanced small cells, cloud Radio Access Networks (RANs), ultra-dense networks, device-to-device (D2D) communication, wireless backhaul, moving network, cooperative communication, Coordinated Multi-Points (CoMP), reception-end interference cancellation and the like.

In the 5G system, Hybrid frequency shift keying (FSK) and quadrature amplitude modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed.

Use of a polar code has been discussed in the 5G system. The polar code suggested by Arikan is the first error correcting code theoretically proved to achieve channel capacity. However, as a code length N increases, a minimum hamming distance increases in proportion to $\sqrt{N}$. Accordingly, performance is degraded if the code length is not sufficiently large. Triponov suggested a polar code design method for acquiring a linear code of the considerable minimum hamming distance by dynamically assigning a frozen bit of the polar code. However, such a polar code is subject to low reliability of a bit-channel to which an information bit is assigned and thus the performance is degraded in successive cancellation list (SCL) decoding.

SUMMARY

To address the above-discussed deficiencies of the prior art, it is a primary aspect of the present disclosure to provide an apparatus and a method for determining a linear code to design a polar code based on a successive cancellation list (SCL) decoding list size and a polar code length in a wireless communication system.

Another aspect of the present disclosure is to provide an apparatus and a method for designing a polar code by determining a different frozen bit value using not only an information bit value but also a frozen bit value in a wireless communication system.

According to one aspect of the present disclosure, a method for operating a transmitting stage in a wireless communication system includes generating a signal by encoding an input bit sequence according to a polar code determined from a linear code, and transmitting the signal to a receiving stage. The input bit sequence includes a second frozen bit which is determined based on a first frozen bit and an information bit, and the first frozen bit and the information bit precede the second frozen bit in the input bit sequence.

According to another aspect of the present disclosure, an apparatus of a transmitting stage in a wireless communication system includes at least one transceiver, and at least one processor functionally coupled to the at least one transceiver. The at least one processor controls to generate a signal by encoding an input bit sequence according to a polar code determined from a linear code, and to transmit the signal to a receiving stage. The input bit sequence includes a second frozen bit which is determined based on a first frozen bit and an information bit, and the first frozen bit and the information bit precede the second frozen bit in the input bit sequence.

The apparatus and the method according to various embodiments of the present disclosure may determine the linear code based on the SCL decoding list size and the polar code length, and thus determine an optimal linear code to design the polar code.

The apparatus and the method according to various embodiments of the present disclosure may improve the polar coding performance by using the number of the second frozen bits optimized for given code length and coding rate.

In addition, the apparatus and the method according to various embodiments of the present disclosure may improve the polar coding performance by determining a different frozen bit based on the frozen bit and the information bit.

Effects which can be acquired by the disclosure are not limited to the above described effects, and other effects that have not been mentioned may be clearly understood by those skilled in the art from the following description.

DETAILED DESCRIPTION

The terms used in the present disclosure are only used to describe specific embodiments, and are not intended to limit the present disclosure. As used herein, singular forms may include plural forms as well unless the context clearly indicates otherwise. Unless defined otherwise, all terms used herein, including technical and scientific terms, have the same meaning as those commonly understood by a person skilled in the art to which the present disclosure pertains. Terms such as those defined in a generally used dictionary may be interpreted to have the meanings equal to the contextual meanings in the relevant field of art, and are not to be interpreted to have ideal or excessively formal meanings unless clearly defined in the present disclosure. In some cases, even where a term is defined in the present disclosure, it should not be interpreted to exclude embodiments of the present disclosure.

In various embodiments of the present disclosure to be described below, a hardware approach will be described as an example. However, since the various embodiments of the present disclosure include a technology using both hardware and software, the present disclosure does not exclude a software-based approach.

The present disclosure provides an apparatus and a method for determining a polar code in a wireless communication system. Specifically, the present disclosure provides a technique for determining the polar code from a linear code in the wireless communication system.

Terms indicating codes (e.g., a linear code, a polar code), terms indicating bits (e.g., an information bit, a frozen bit), terms indicating network entities, and terms indicating components of a device (appropriately modified according to the invention) are mentioned for the sake of explanations. Accordingly, the disclosure is not limited to the terms to be described, and may use other terms having technically identical meaning.

The present disclosure provides various embodiments with terms used in some communication standards (e.g., $3^{rd}$ Generation Partnership Project (3GPP)) by way of example. Various embodiments of the present disclosure may be easily used in other communication systems.

Figure 1:
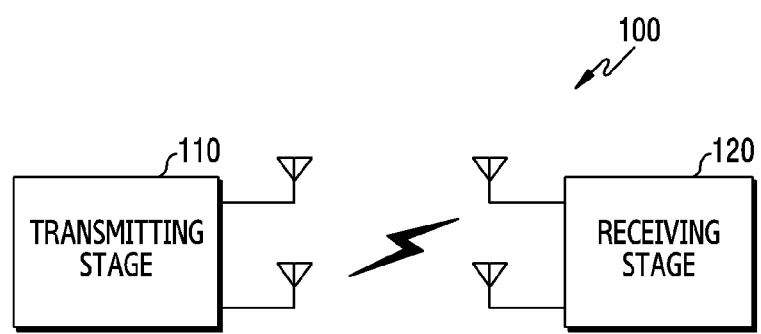
FIG. 1 illustrates a wireless communication system according to various embodiments of the present disclosure.

FIG. 1 illustrates a wireless communication system according to various embodiments of the present disclosure. FIG. 1 illustrates, as some of nodes which use a radio channel in the wireless communication system, a transmitting stage 110 and a receiving stage 120. While one transmitting stage 110 and one receiving stage 120 are depicted in FIG. 1, a plurality of transmitting stages and a plurality of receiving stages may be included. While the transmitting stage 110 and the receiving stage 120 are separate entities in the disclosure for the sake of explanations, functions of the transmitting stage 110 and the receiving stage 120 may be exchanged. For example, the transmitting stage 110 may be a terminal and the receiving stage 120 may be a base station in uplink of a cellular communication system, and the transmitting stage 110 may be the base station and the receiving stage 120 may be the terminal in downlink.

In some embodiments, the transmitting stage 110 may transmit a signal generated by encoding an input bit sequence according to a polar code determined from a linear code, to the receiving stage 120. Herein, the polar code determined from the linear code indicates a polar code designed to include the same or partially same codewords as a corresponding linear code. The polar code may be referred to as a polar subcode, because the polar code becomes a subcode of the linear code by configuring some of information bits of the input bit sequence according to the linear code, as frozen bits (e.g., static frozen bit, dynamic frozen bit). The linear code is a code for designing the polar subcode and may be referred to as a mother code.

Figure 2:
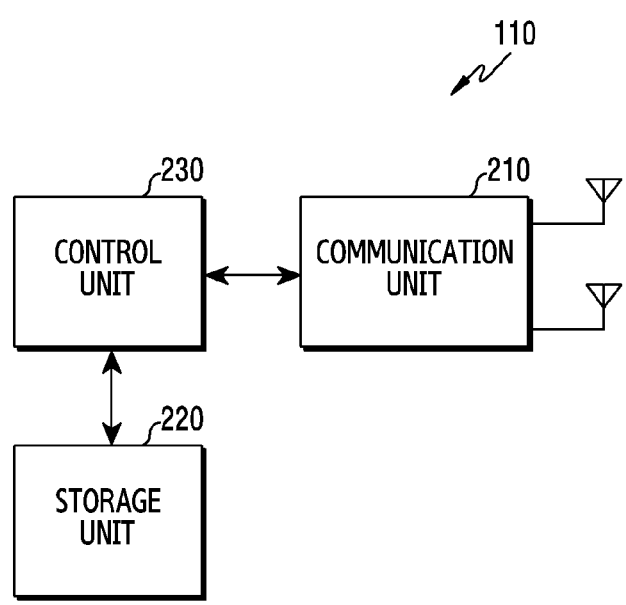
FIG. 2 illustrates an example of a transmitting stage in a wireless communication system according to various embodiments of the present disclosure.

FIG. 2 illustrates an example of an apparatus in a wireless communication system according to various embodiments of the present disclosure. That is, the configuration of FIG. 2 may be understood as the configuration of the transmitting stage 110. A term such as 'portion' or '~er' indicates a unit for processing at least one function or operation, and may be implemented using hardware, software, or a combination of hardware and software.

Referring to FIG. 2, the transmitting stage 110 may include a communication unit 210, a storage unit 220, and a control unit 230.

The communication unit 210 may transmit and receive signals over a radio channel. For example, the communication unit 210 may perform a conversion function between a baseband signal and a bit string according to a physical layer standard of the system. For example, in data transmission, the communication unit 210 may generate complex symbols by encoding and modulating a transmit bit string. Also, in data reception, the communication unit 210 may restore a receive bit string by demodulating and decoding a baseband signal. Further, the communication unit 210 may up-convert the baseband signal to a radio frequency (RF) band signal, transmits it via an antenna, and down-convert an RF band signal received via an antenna to a baseband signal.

For doing so, the communication unit 210 may include a transmit filter, a receive filter, an amplifier, a mixer, an oscillator, a digital to analog convertor (DAC), an analog to digital convertor (ADC), and the like. Also, the communication unit 210 may include a plurality of transmit and receive paths. Further, the communication unit 210 may include at least one antenna array including a plurality of antenna elements. In terms of hardware, the communication unit 210 may include a digital circuit and an analog circuit, and the analog unit may include a plurality of sub-units according to an operating power and an operating frequency.

As such, the communication unit 210 transmits and receives the signals. Hence, the communication unit 210 may be referred to as a transmitter, a receiver, or a transceiver. Hereafter, the transmission and the reception over the wireless channel embrace the above-stated processing of the communication unit 210. In addition, the communication unit 210 may include a backhaul communication unit for communicating with other network entity connected over a backhaul network.

The storage unit 220 may store a basic program for operating the transmitting stage 110, an application program, and data such as setting information. The storage unit 220 may include a volatile memory, a non-volatile memory, or a combination of a volatile memory and a non-volatile memory. The storage unit 220 may provide the stored data in response to a request of the control unit 230.

The control unit 230 controls general operations of the transmitting stage 110. For example, the control unit 230 may transmit and receive signals through the communication unit 220. Also, the control unit 230 may record and read data in and from the storage unit 220. For doing so, the control unit 230 may include at least one processor or micro-processor, or may be part of the processor. In other words, the control unit 230 may control operations of the components of the communication unit 220.

According to various embodiments, the control unit 230 may control to transmit a signal generated by encoding an input bit sequence according to a polar code determined from a linear code, to the receiving stage 120. Herein, the linear code may be determined based on a successive cancellation list (SCL) decoding list size and a length of the polar code. The input bit sequence may include frozen bits each determined based on a preceding frozen bit and a preceding information bit. For example, the control unit 230 may control transmitting stage 110 to fulfill operations, to be described, according to various embodiments.

Figure 3:
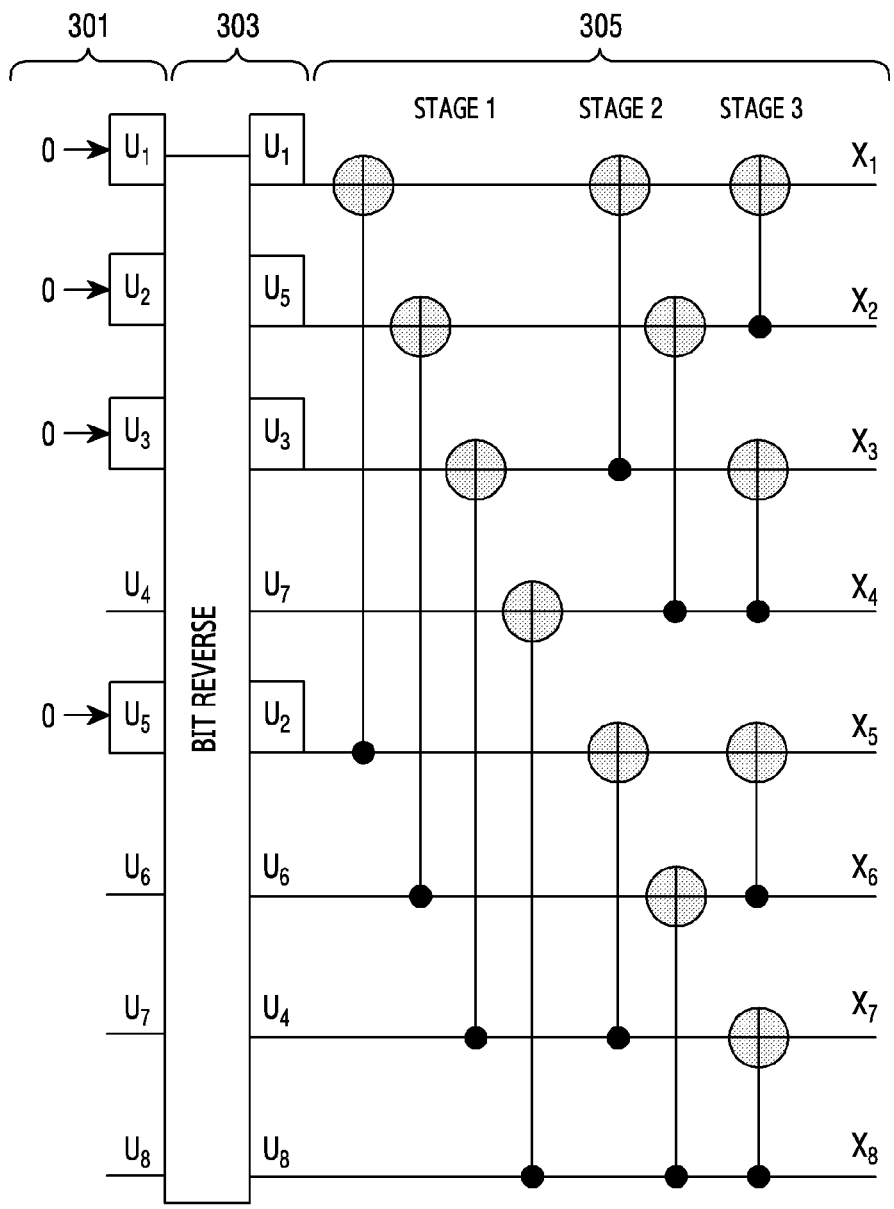
FIG. 3 illustrates an example of a coding process using a polar code in a wireless communication system according to various embodiments of the present disclosure.

FIG. 3 illustrates an example of a coding process using a polar code in a wireless communication system according to various embodiments of the present disclosure.

Referring to FIG. 3, the coding process using the polar code includes a polar code input process 301, a bit reverse process 303, and a codeword generating process 305.

The polar code input process 301 may indicate a process for assigning information bits and frozen bits to bits of an input bit sequence according to the polar code. That is, the polar code input process 301 may assign the input bit sequence including the information bits and the frozen bits to a source vector. For example, the information bits may be assigned to elements $u_4$, $u_6$, $u_7$, and $u_8$ of the source vector $u_A$. The frozen bits may be assigned to elements $u_1$, $u_2$, $u_3$, and $u_5$. Herein, the frozen bit may indicate a bit assigned a zero frozen value at the bit position of low reliability in a bit-channel. The frozen bit may be referred to as a zero bit according to its technical meaning or other name having the technically equivalent meaning. In some embodiments, if the polar code is a linear block code having a code length N ($=2^n$), the information bits in the source vector $u_A$ may be assigned to bits corresponding to K-ary elements of an information set A and the frozen bits may be assigned to bits corresponding to (N−K)-ary elements. Herein, the information set A may indicate a subset having an index size K for rows of a generator matrix A as expressed in Equation 1.

$$A = B_N F^{\otimes n} \quad (1)$$

A denotes the generator matrix, $B_N$ denotes a bit-reversal permutation matrix of a size N×N for the bit reverse process 303, F denotes a polar code matrix for the codeword generating process 305, and $F^{\otimes n}$ denotes an n-times Kronecker product of F. For example, F may be defined as Equation 2.

$$F = \begin{bmatrix} 1 & 0 \\ 1 & 1 \end{bmatrix} \quad (2)$$

The bit reverse process 303 may rearrange the elements of the source vector. Specifically, the bit reverse process 303 may rearrange the elements to correspond to the reverse of binary values of the indexes of the elements of the source vector. For example, the indexes of the elements $u_1$, $u_2$, $u_3$, $u_4$, $u_5$, $u_6$, $u_7$, and $u_8$ of the source vector may be expanded to binary three bits of 000, 001, 010, 011, 100, 101, 110, and 111. If the index order is maintained and the first and third bits are reversed, the binary values become 000, 100, 010, 110, 001, 101, 011, and 111. These binary values may be converted to integers, and the elements may be rearranged to $u_1$, $u_5$, $u_3$, $u_7$, $u_2$, $u_6$, $u_4$, and $u_8$. In some embodiments, the bit revere process 303 may be omitted.

The codeword generating process 305 may generate a polar codeword using a polar code matrix. In some embodiments, the polar codeword may be defined as Equation 3.

$$c = u_A A \quad (3)$$

c denotes the polar codeword, $u_A$ denotes the source vector, and A denotes the generator matrix. The polar codeword may be expressed as a code vector including elements $x_1$, $x_2$, $x_3$, $x_4$, $x_5$, $x_6$, $x_7$, and $x_8$.

The method for determining the polar code has been described in the polar code input process 301 of FIG. 3. Besides, there are various methods for determining the polar code. If some of the frozen bits are configured with a combination of the information bits, the polar code may be designed to have the same codewords as the linear code of the code length N($=2^n$). In some embodiments, if Equation 4 is satisfied, the polar codeword c may become a codeword of a (N,K,d) linear code C having a parity check matrix H to design the polar code based on the dynamic frozen bit, where N denotes the code length, K denotes an information bit length, and d denotes a minimum hamming distance.

$$cH^T = u_A A H^T = u_A (HA^T)^T = 0 \quad (4)$$

C denotes the polar codeword, H denotes the parity check matrix, $u_A$ denotes the source vector, and A denotes the generator matrix. Using Gaussian elimination on $HA^T$, a constraint matrix v may be defined as Equation 5.

$$v = QHA^T \quad (5)$$

v denotes the constraint matrix, Q denotes an invertible matrix for the Gaussian elimination, wherein all rows of v have their last 1 in different columns, H denotes the parity check matrix, and A denotes the generator matrix. For each row of v, the index of the last element which is not zero may be defined as Equation 6.

$$j_i = \max\{t | V_{i,t} \neq 0\} \quad (6)$$

$j_i$ denotes the index of the last element which is not zero, for each row of v. $j_i$ has different values according to properties of v. Thus, a constraint condition of the information bit which makes the polar code the subcode of the linear code C may be expressed as Equation 7.

$$u_{j_i} = \sum_{s=0}^{j_i-1} u_s V_{i,s}, \ 0 \leq i < N - K \quad (7)$$

$u_{j_i}$ denotes the information bit of the polar code.

The polar code determining method based on the existing linear code as stated above does not provide a determination criterion for determining the linear code but merely uses the information bit values in determining the dynamic frozen bit value. However, the polar code determining method based on the linear code according to various embodiments of the present disclosure may determine an optimal linear code for designing the polar code by determining the linear code based on the SCL decoding list size and the polar code length, improve coding performance by adding the dynamic frozen bit to the generated polar code, and improve polar coding performance by determining other dynamic frozen bit based on the dynamic frozen bit and the information bit.

Figure 4:
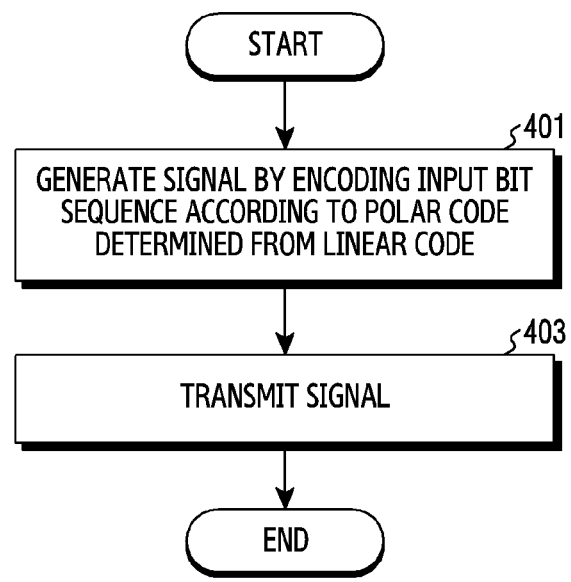
FIG. 4 illustrates a flowchart of a transmitting stage in a wireless communication system according to various embodiments of the present disclosure.

FIG. 4 illustrates a flowchart of a transmitting stage in a wireless communication system according to various embodiments of the present disclosure. FIG. 4 illustrates an operating method of the transmitting stage 110.

Referring to FIG. 4, in operation 401, the transmitting stage generates a signal by encoding an input bit sequence including first frozen information bits, and second frozen bits according to a polar code determined from a linear code. In some embodiments, the linear code may be determined based on an SCL decoding list size and a polar code length. In other embodiments, the polar code may be a polar subcode of the linear code with some of the information bits of the input bit sequence changed to a static frozen bit. Herein, the static frozen bit may indicate a frozen bit which is known to both of the transmitting stage and the receiving stage (e.g., the receiving stage 120) for channel polarization. For example, the static frozen bit may have a value of 0. In some other embodiments, the polar code may indicate a polar subcode of the linear code by changing some of a candidate group including some of the static frozen bits and some of the information bits to a dynamic frozen bit. Herein, the dynamic frozen bit may indicate a frozen bit determined based on at least one of a preceding frozen bit and a preceding information bit in the input bit sequence. For example, the dynamic frozen bit may have a value of 0 or 1.

In operation 403, the transmitting stage transmits the signal to the receiving stage. Herein, each bit of the bit sequence of the signal may be transmitted to the receiving stage over each bit-channel.

Figure 5:
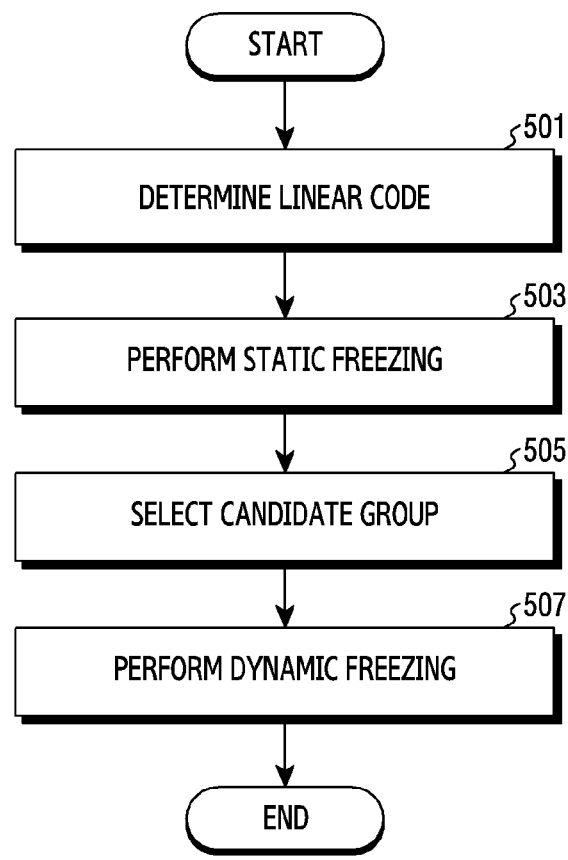
FIG. 5 illustrates a flowchart of a method for determining a polar code from a linear code in a wireless communication system according to various embodiments of the present disclosure.

FIG. 5 illustrates a flowchart of a method for determining a polar code in a wireless communication system according to various embodiments of the present disclosure. While FIG. 5 illustrates an operating method of the transmitting stage 110, the operations of FIG. 5 may be fulfilled by various entities (e.g., a code designer, a system operator).

Referring to FIG. 5, the transmitting stage determines a linear code in operation 501. In some embodiments, the linear code may be determined based on an SCL decoding list size and a polar subcode length. For example, the linear code may be determined based on Equation 8 and Equation 9.

$$R_0 = \begin{cases} R, & R' < R \\ R', & R \leq R' < 1 \\ 1, & R' \geq 1 \end{cases} \quad 8)$$

R denotes a coding rate of the polar subcode, and $R_0$ denotes a coding rate of the linear code. R' is determined based on Equation 9.

$$R' = c_1 + c_2 \log_2 L + c_3 \log_2 N \quad (9)$$

L denotes the SCL decoding list size, and N denotes the polar subcode length. $c_1$, $c_2$, and $c_3$ denote parameters experimentally determined. Hence, the transmitting stage 110 may determine a linear code (N,K) having the coding rate $R_0(=K'/N)$. That is, the transmitting stage 110 may determine an optimal linear code for designing the polar code, by determining the linear code based on the SCL decoding list size and the polar subcode length. In general, the transmitting stage 110 selects the linear code of a higher coding rate than the coding rate of the polar code to design. After generating the polar code having the same codeword set as the selected linear code, the transmitting stage 110 may achieve the coding rate of the polar code to use, through additional static freezing.

Figure 6A:
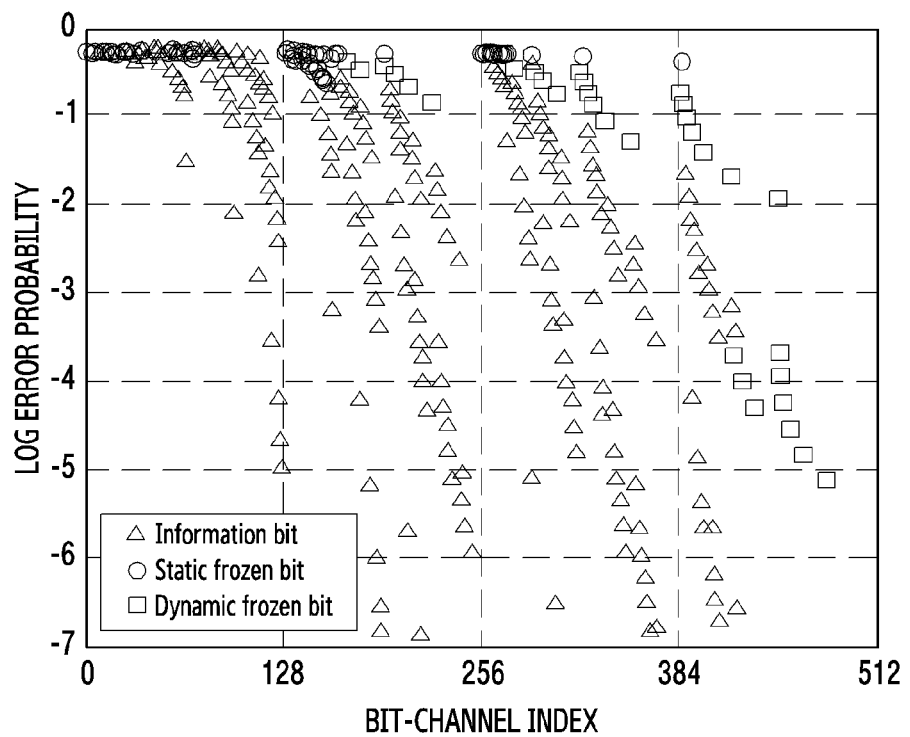
FIG. 6A illustrates an error probability graph of a bit-channel of a linear code in a wireless communication system according to various embodiments of the present disclosure.
Figure 6B:
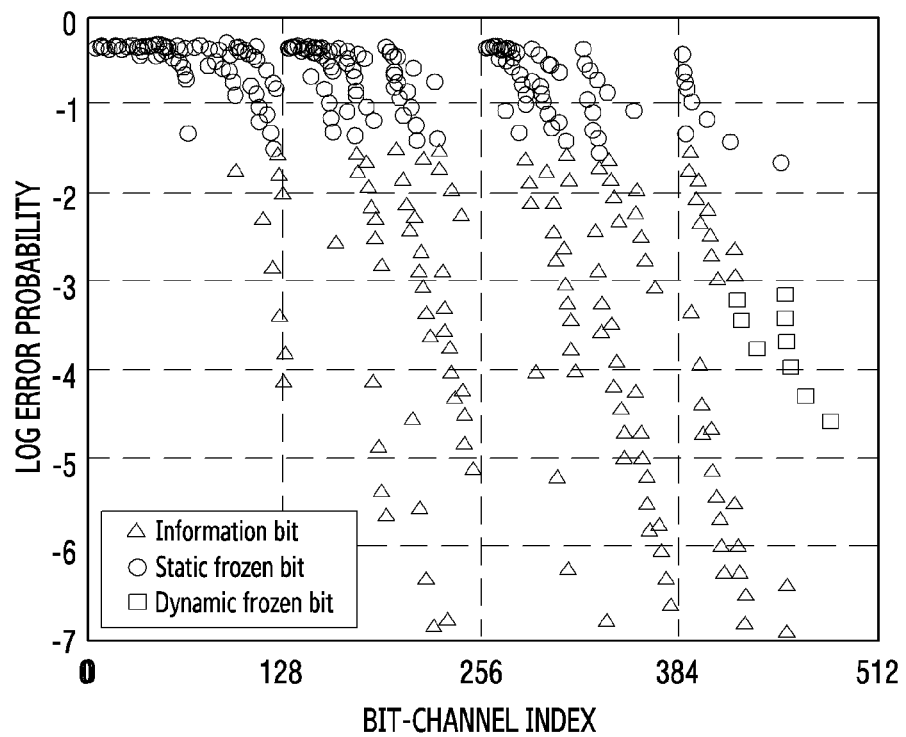
FIG. 6B illustrates an error probability graph of a bit-channel of a polar code which is statically frozen in a wireless communication system according to various embodiments of the present disclosure.

In operation 503, the transmitting stage 110 performs the additional static freezing on the polar code generated from the linear code. That is, the transmitting stage 110 may change some of the information bits of the input bit sequence to static frozen bits. For example, the polar subcode (N,K) may be designed by changing K'-K-ary information bits of the input bit sequence of the polar code (N,K') to the static frozen bits. In some embodiments, the information bits to be changed to the static frozen bits may be determined based on reliability of the bit-channel. In this case, referring to FIGS. 6A and 6B, information bits of high error probability are changed to the static frozen bits. That is, the K'-K-ary information bits of the low reliability of the bit channel are changed to the static frozen bits. Herein, a final polar code is determined by the additional static freezing of the polar code having the same codeword set as the linear code, and the determined polar code becomes a subcode of the linear code. If a codeword set of a code A is included in a codeword set of a code B, the code A is referred to as a subcode of the code B.

Figure 6C:
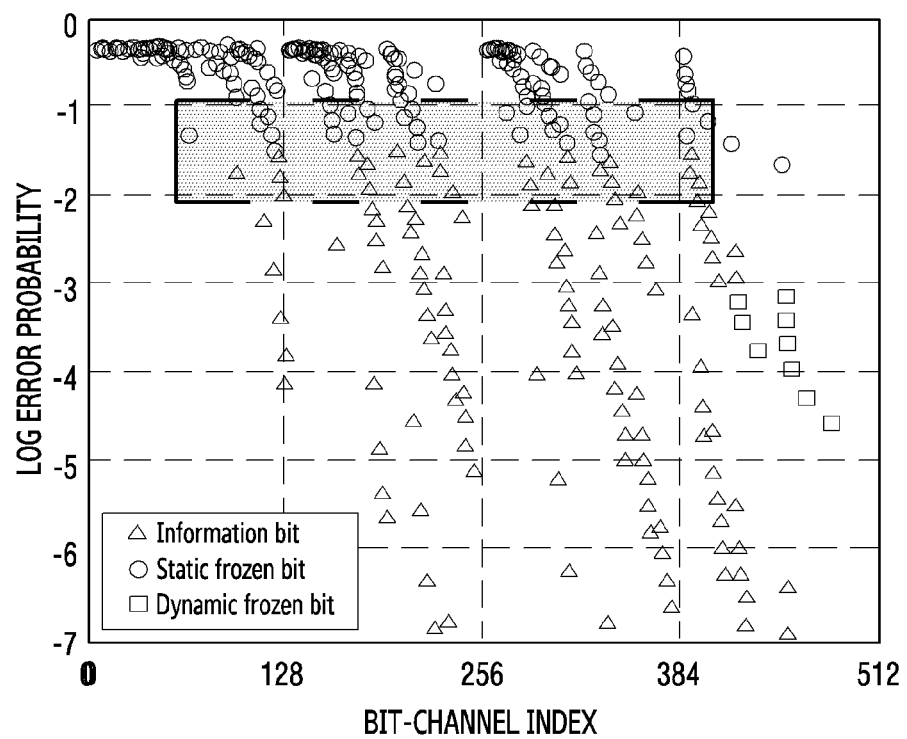
FIG. 6C illustrates an error probability graph of a bit-channel representing a candidate group for dynamically freezing a static frozen polar code in a wireless communication system according to various embodiments of the present disclosure.

In operation 505, the transmitting stage selects a candidate group for dynamic freezing. In some embodiments, the candidate group may include some of the static frozen bits, having low reliability of the bit-channel, and some of the information bits, having low reliability of the bit-channel. For example, the candidate group may include a $\alpha \cdot$(K'-K)-ary static frozen bits and $\beta \cdot$K-ary information bits. $\alpha(0<\alpha\leq1)$ and $\beta(0<\beta\leq1)$ may be design parameters. For example, $\alpha$ and $\beta$ may be determined based on the error probability. In this case, referring to FIG. 6C, a dotted box indicates a candidate group selected based on the bit-channel reliability.

Figure 6D:
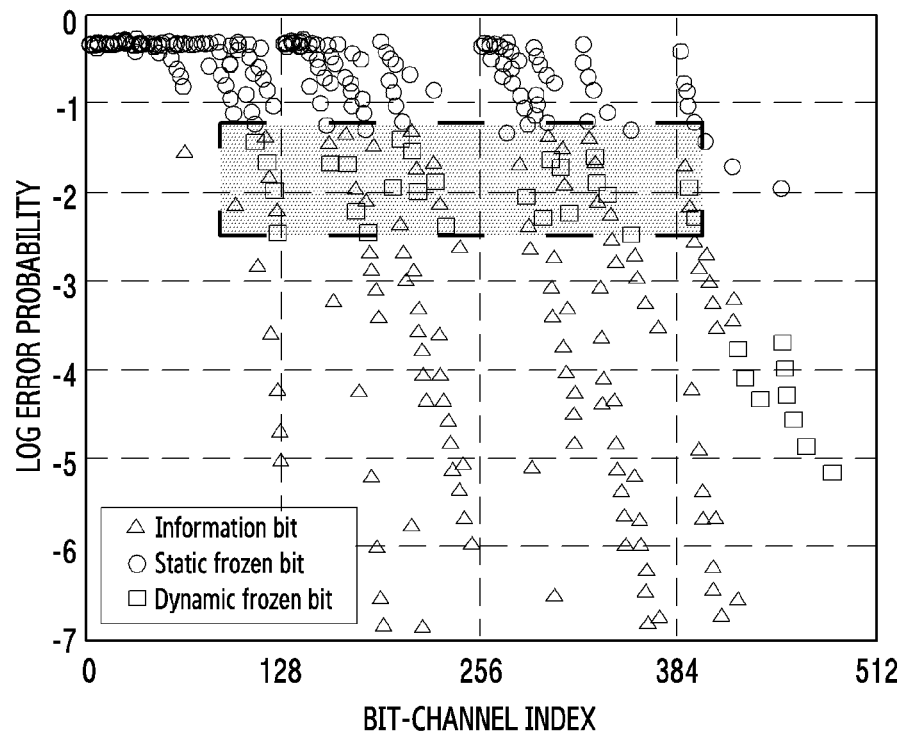
FIG. 6D illustrates an error probability graph of a bit-channel of a polar code is dynamically frozen in a wireless communication system according to various embodiments of the present disclosure.

In operation 507, the transmitting stage performs the dynamic freezing on the candidate group. That is, the transmitting stage may divide the bits of the candidate group into dynamic frozen bits and information bits, and determine values of the dynamic frozen bits. In doing so, the transmitting stage 110 may determine some, having low bit-channel reliability, of the bits of the candidate group, as the dynamic frozen bits, and determine some of the remaining bits of the candidate group as the information bits. For example, with α·(K'-K)+β·K-ary bits of the candidate group, the transmitting stage 110 may determine α·(K'-K)-ary bits having low bit-channel reliability, as the dynamic frozen bits and determine the remaining β·K-ary bits as the information bits. In the candidate group, the transmitting stage 110 may determine a second dynamic frozen bit value based on at least one of a first dynamic frozen bit value and at least one information bit values of a first information bit group. This is efficient in eliminating an incorrect path in the SCL decoding, and thus the polar coding performance may be improved. Herein, the first dynamic frozen bit and the first information bit group may precede the second dynamic frozen bit in the bit sequence. In this case, referring to FIGS. 6C and 6D, some bits in the dotted box corresponding to the candidate group are determined as the dynamic frozen bits, and the remaining bits are determined as the information bits.

Figure 7:
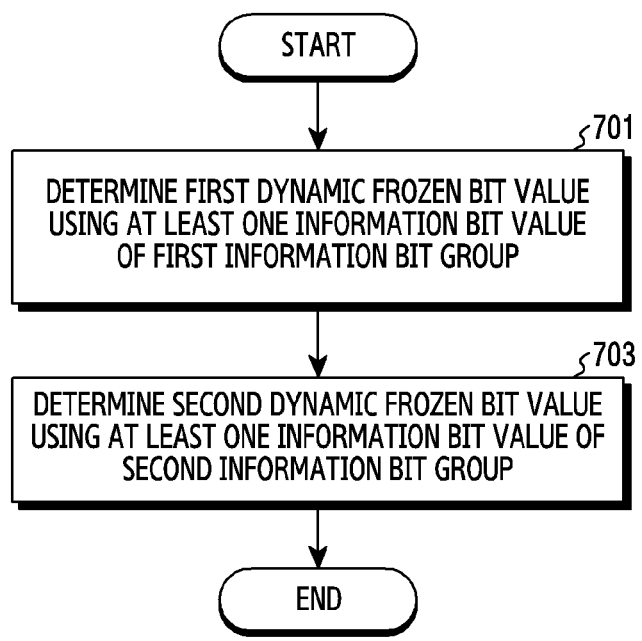
FIG. 7 illustrates a flowchart of a method for determining a dynamic frozen bit value in a wireless communication system according to various embodiments of the present disclosure.

FIG. 7 illustrates a flowchart of a method for determining a dynamic frozen bit value in a wireless communication system according to various embodiments of the present disclosure. While FIG. 7 illustrates an operating method of the transmitting stage 110, the operations of FIG. 7 may be fulfilled by various entities (e.g., a system operator). FIG. 7 illustrates details of operation 507 of FIG. 5.

Figure 8:
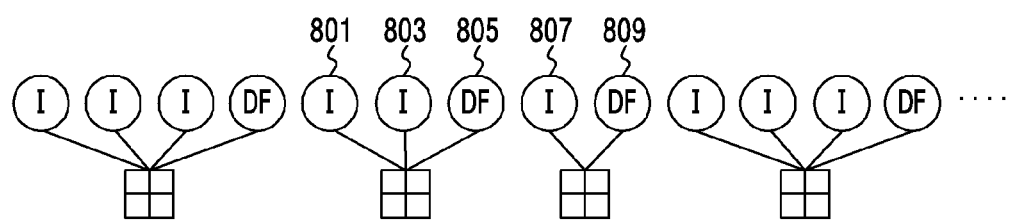
FIG. 8 illustrates a first example for determining a dynamic frozen bit value in a wireless communication system according to various embodiments of the present disclosure.

Referring to FIG. 7, in operation 701, the transmitting stage 110 determines a first dynamic frozen bit value using at least one information bit value of a first information bit group. In some embodiments, the first dynamic frozen bit value may be determined as a combination of at least one bit value of the first information bit group. Herein, the first information bit group may be positioned before the first dynamic frozen bit in a bit sequence. For example, referring to FIG. 8, a value of a first dynamic frozen bit 805 may be determined using a combination of values of an information bit 801 and an information bit 803 of a first information bit group.

In operation 703, the transmitting stage 110 determines a second dynamic frozen bit value using at least one information bit value of a second information bit group. In some embodiments, the second dynamic frozen bit value may be determined as a combination of at least one bit value of the second information bit group. Herein, the second information bit group may be positioned before the second dynamic frozen bit in the bit sequence. For example, referring to FIG. 8, a value of a second dynamic frozen bit 809 may be determined based on a value of an information bit 807 of a second information bit group.

Figure 9:
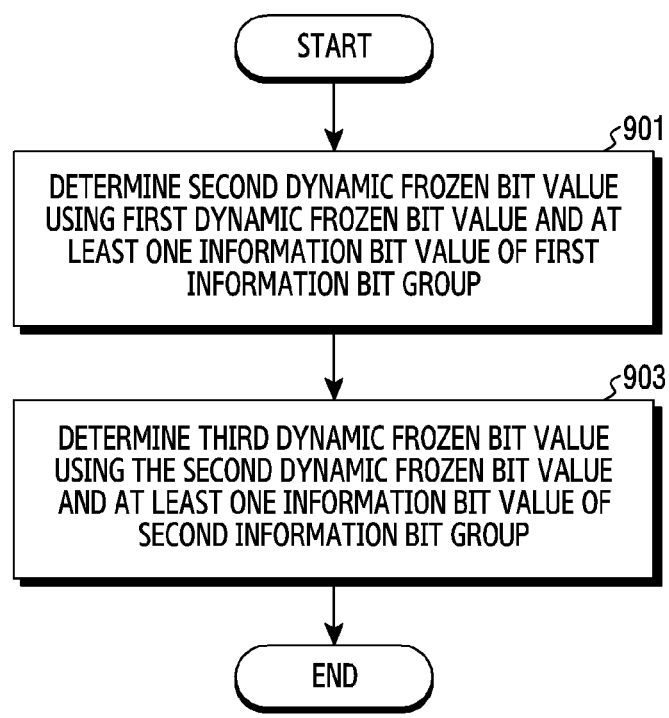
FIG. 9 illustrates another flowchart of a method for determining a dynamic frozen bit value in a wireless communication system according to various embodiments of the present disclosure.

FIG. 9 illustrates another flowchart of a method for determining a dynamic frozen bit value in a wireless communication system according to various embodiments of the present disclosure. While FIG. 9 illustrates an operating method of the transmitting stage 110, the operations of FIG. 9 may be fulfilled by various entities (e.g., a system operator). FIG. 9 illustrates details of operation 507 of FIG. 5.

Figure 10:
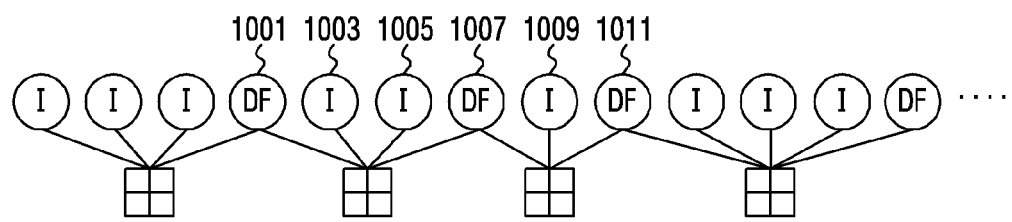
FIG. 10 illustrates a second example for determining a dynamic frozen bit value in a wireless communication system according to various embodiments of the present disclosure.
Figure 11:
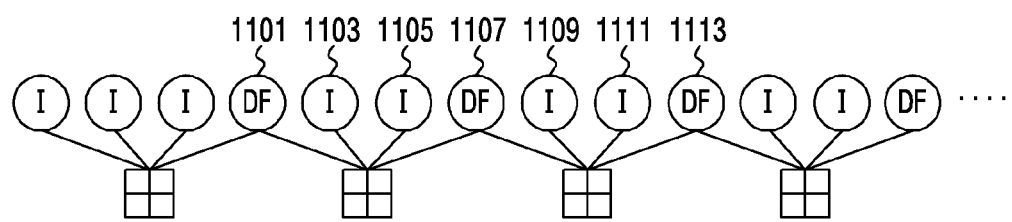
FIG. 11 illustrates a third example for determining a dynamic frozen bit value in a wireless communication system according to various embodiments of the present disclosure.

Referring to FIG. 9, in operation 901, the transmitting stage 110 determines a second dynamic frozen bit value using a first dynamic frozen bit value and at least one information bit value of a first information bit group. In some embodiments, the second dynamic frozen bit value may be determined as a combination of the first dynamic frozen bit value and at least one information bit value of the first information bit group. Herein, the first dynamic frozen bit and the first information bit group may precede the second dynamic frozen bit in the bit sequence. For example, referring to FIG. 10, a value of a second dynamic frozen bit 1007 may be determined using a combination of a value of a first dynamic frozen bit 1001 and values of an information bit 1003 and an information bit 1005 of a first information bit group. For example, referring to FIG. 11, if dynamic frozen bits are disposed at regular intervals in a candidate group, a value of a second dynamic frozen bit 1107 may be determined as a combination of a value of a first dynamic frozen bit 1101 and values of an information bit 1103 and an information bit 1105 of the first information bit group.

In operation 903, the transmitting stage 110 determines a third dynamic frozen bit value using the second dynamic frozen bit value and at least one information bit value of a second information bit group. In some embodiments, the third dynamic frozen bit value may be determined as a combination of the second dynamic frozen bit value and at least one information bit value of the second information bit group. Herein, the second dynamic frozen bit and the second information bit group may precede the third dynamic frozen bit in the bit sequence. For example, referring to FIG. 10, a value of a third dynamic frozen bit 1011 may be determined as a combination of a value of a second dynamic frozen bit 1007 and a value of an information bit 1009 of the second information bit group. For example, referring to FIG. 11, if dynamic frozen bits are disposed at regular intervals in the candidate group, a value of a third dynamic frozen bit 1113 may be determined as a combination of a value of a second dynamic frozen bit 1107 and values of an information bit 1109 and an information bit 1111 of the second information bit group. Herein, the dynamic frozen bits at regular intervals in the candidate group may indicate that the number of at least one information bit of the first information bit group is equal to the number of at least one information bit of the second information bit group.

Figure 12A:
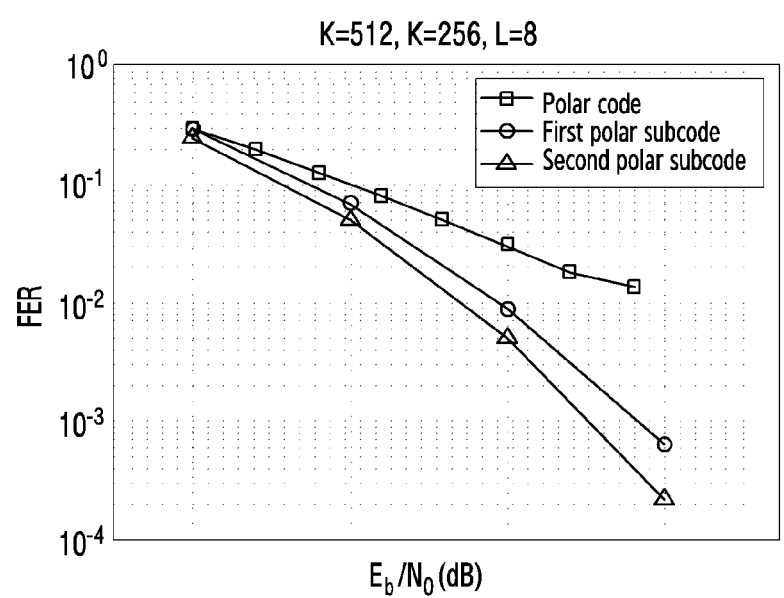
FIGS. 12A and 12B illustrate a performance graph of polar subcodes in a wireless communication system according to various embodiments of the present disclosure.
Figure 12B:
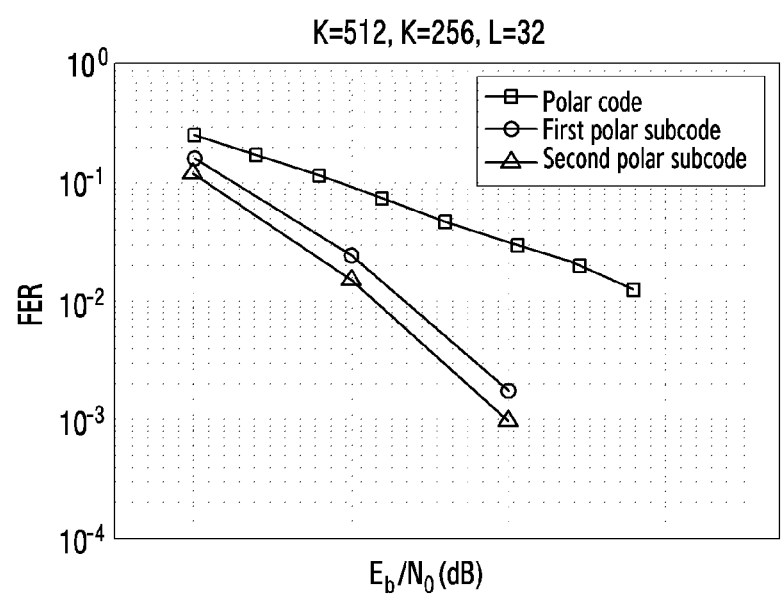

FIGS. 12A and 12B illustrate a performance graph of polar subcodes in a wireless communication system according to various embodiments of the present disclosure.

Referring to FIGS. 12A and 12B, it is assumed that the code length N is 512, the coding rate R is 0.5, the SCL decoding list size L is 8 and 32. In this case, a polar code includes only static frozen bits, a first polar subcode indicates a polar subcode designed using a conventional method (e g., the method suggested by Trifonov), and a second polar subcode indicates a polar subcode according to various embodiments of the present disclosure. Based on the performance graphs of FIGS. 12A and 12B, the second polar subcode exhibits the best performance. That is, with the same $E_b|N_o$ (energy per bit to noise spectral density ratio), the second polar subcode exhibits the lowest frame error rate (FER).

The methods according to the embodiments described in the claims or the specification of the present disclosure may be implemented in software, hardware, or a combination of hardware and software.

If implementing in software, a computer-readable storage medium storing one or more programs (software modules) may be provided. One or more programs stored in the computer-readable storage medium may be configured for execution by one or more processors of an electronic device. One or more programs may include instructions for controlling the electronic device to execute the methods according to the embodiments described in the claims or the specification of the present disclosure.

Such a program (software module, software) may be stored to a random access memory, a non-volatile memory including a flash memory, a read only memory (ROM), an electrically erasable programmable read only memory (EEPROM), a magnetic disc storage device, a compact disc (CD)-ROM, digital versatile discs (DVDs) or other optical storage devices, and a magnetic cassette. Alternatively, the program may be stored to a memory combining part or all of those recording media. Also, a plurality of memories may be included.

Also, the program may be stored in an attachable storage device accessible a communication network such as Internet, Intranet, local area network (LAN), wide LAN (WLAN), or storage area network (SAN), or a communication network by combining these networks. The storage device may access the device which implements the embodiment of the present disclosure through an external port. Also, a separate storage device may access the device which implements the embodiment of the present disclosure over the communication network.

In the specific embodiments of the present disclosure, the elements included in the disclosure are expressed in a singular or plural form according to the specific embodiment. However, the singular or plural expression is appropriately selected according to a proposed situation for the convenience of explanation, the present disclosure is not limited to a single element or a plurality of elements, the elements expressed in the plural form may be configured as a single element, and the elements expressed in the singular form may be configured as a plurality of elements.

Meanwhile, the detailed description of the present disclosure has explained specific embodiments thereof, but various modifications may be made without departing from the scope of this disclosure. Therefore, the scope of this disclosure should not be limited to the described embodiments but should be defined by the claims as below and their equivalents within the scope of the claims.

What is claimed is:

1. An apparatus of a transmitting stage in a wireless communication system, comprising:
    at least one transceiver; and
    at least one processor functionally coupled to the at least one transceiver,
    wherein the at least one processor is configured to:
        generate a signal by encoding an input bit sequence according to a polar code determined from a linear code, and
        transmit the signal to a receiving stage,
    wherein the input bit sequence comprises a second frozen bit which is determined based on a first frozen bit and an information bit, and the first frozen bit and the information bit precede the second frozen bit in the input bit sequence.

2. The apparatus of claim 1, wherein the linear code is determined based on a list size of successive cancellation list (SCL) decoding and a length of the polar code.

3. The apparatus of claim 2, wherein the SCL decoding list size and the polar code length are used to determine a coding rate of the linear code, and
    the coding rate of the linear code is used to determine a length of an information bit of the linear code.

4. The apparatus of claim 1, wherein the input bit sequence comprises an input bit sequence of the linear code, where some of information bits are changed to static frozen bits.

5. The apparatus of claim 4, wherein some of the information bits are determined based on an error probability of the information bits.

6. The apparatus of claim 4, wherein some of the information bits and some of the static frozen bits are determined as a candidate group to determine a first dynamic frozen bit and a second dynamic frozen bit.

7. The apparatus of claim 6, wherein the first dynamic frozen bit and the second dynamic frozen bit are two bits of the lowest error probability for a bit-channel among bits of the candidate group.

8. The apparatus of claim 6, wherein a value of the first dynamic frozen bit is determined based on a value of at least one information bit of a first information bit group of the candidate group, and
    a value of the second dynamic frozen bit is determined based on a value of at least one information bit of a second information bit group of the candidate group.

9. The apparatus of claim 6, wherein a value of the second dynamic frozen bit is determined based on a value of the first dynamic frozen bit and values of information bits of a first information bit group in the candidate group, and
    a value of a third dynamic frozen bit is determined based on a value of the second dynamic frozen bit and values of information bits of a second information bit group in the candidate group.

10. The apparatus of claim 9, wherein the number of the information bits in the first information bit group is equal to the number of the information bits in the second information bit group.

11. A method for operating a transmitting stage in a wireless communication system, comprising:
    generating a signal by encoding an input bit sequence according to a polar code determined from a linear code; and
    transmitting the signal to a receiving stage,
    wherein the input bit sequence comprises a second frozen bit which is determined based on a first frozen bit and an information bit, and
    the first frozen bit and the information bit precede the second frozen bit in the input bit sequence.

12. The method of claim 11, wherein the linear code is determined based on a list size of successive cancellation list (SU) decoding and a length of the polar code.

13. The method of claim 12, wherein the SCI, decoding list size and the polar code length are used to determine a coding rate of the linear code, and
    the coding rate of the linear code is used to determine a length of an information bit of the linear code.

14. The method of claim 11, wherein the input bit sequence comprises an input bit sequence of the linear code, where some of information bits are changed to static frozen bits.

15. The method of claim 14, wherein some of the information bits are determined based on an error probability of the information bits.

16. The method of claim 14, wherein some of the information bits and some of the static frozen bits are determined as a candidate group to determine a first dynamic frozen bit and a second dynamic frozen bit.

17. The method of claim 16, wherein the first dynamic frozen bit and the second dynamic frozen bit are two bits of the lowest error probability for a bit-channel among bits of the candidate group.

18. The method of claim 16, wherein a value of the first dynamic frozen bit is determined based on a value of at least one information bit of a first information bit group of the candidate group, and a value of the second dynamic frozen bit is determined based on a value of at least one information bit of a second information bit group of the candidate group.

19. The method of claim 16, wherein a value of the second dynamic frozen bit is determined based on a value of the first dynamic frozen bit and values of information bits of a first information bit group in the candidate group, and a value of a third dynamic frozen bit is determined based on a value of the second dynamic frozen bit and values of information bits of a second information bit group in the candidate group.

20. The method of claim 19, wherein the number of the information bits in the first information bit group is equal to the number of the information bits in the second information bit group.

* * * * *